United States Patent [19]

Gabor et al.

[11] 4,321,588
[45] Mar. 23, 1982

[54] BREADBOARD SYSTEM

[75] Inventors: Robert J. Gabor, Painesville; John N. Tengler, Chardon; Kenneth W. Braund, Newbury, all of Ohio

[73] Assignee: A P Products Incorporated, Mentor, Ohio

[21] Appl. No.: 132,146

[22] Filed: Mar. 20, 1980

[51] Int. Cl.³ .............................................. H02B 1/04
[52] U.S. Cl. .................................... 340/381; 361/393
[58] Field of Search ............... 340/381; 361/331, 346, 361/380, 393, 429

[56] References Cited

U.S. PATENT DOCUMENTS

| | | | |
|---|---|---|---|
| 2,929,965 | 3/1960 | Oden | 361/393 |
| 2,940,016 | 6/1960 | Flint | 361/393 |
| 2,947,914 | 8/1960 | Simons | 361/393 |
| 3,255,330 | 6/1966 | Mackenzie | 361/331 |
| 3,270,251 | 8/1966 | Evans | 361/393 |
| 4,152,750 | 5/1979 | Bremenour | 361/393 |

OTHER PUBLICATIONS

"The Faster and Easier Book", A P Products Incorporated, Jul., 1976.

*Primary Examiner*—Harold I. Pitts
*Attorney, Agent, or Firm*—Maky, Renner, Otto & Boisselle

[57] ABSTRACT

A breadboard assembly to facilitate connecting electrical circuits comprises a breadboard member including a housing, plural electrical contacts in the housing, openings, in at least one surface of the housing for permitting access for connection to respective contacts by a member inserted therein, and a tray for adjustably holding at least one member in operative position therein. The breadboard member may be a terminal strip including in its housing contacts for electrically connecting plural members inserted to engagement therewith, a distribution strip including in its housing one or more contact sets for distributing power to members inserted into engagement therewith, a discrete strip having in its housing contacts arranged in a pattern to accept relatively large size electric or electronic components, a display strip having in its housing an arrangement of contacts for facilitating connections of seven segment alphanumeric displays or the like, a light emitting diode strip having in its housing a contact arrangement that facilitates connections for light emitting diodes, and possibly other types of strips. Means are provided to connect plural trays side-by-side and end-to-end.

73 Claims, 14 Drawing Figures

BREADBOARD SYSTEM

TECHNICAL FIELD

The present invention relates generally, as indicated, to breadboard systems and, more particularly, to a relatively low cost, versatile breadboard system having multiple interchangeable and versatile parts intended to facilitate effecting electrical connection among electrical and/or electronic components to construct operative electrical circuits.

BACKGROUND OF PRIOR ART

A typical prior electrical breadboard apparatus has an electrically non-conductive housing of, for example, injection molded plastic or plastic-like material, formed with a plurality of compartments with each typically having an opening in a top housing surface for access to the compartment usually by insertion of an electrical lead or the like therethrough. An electrical contact is positioned in each compartment to connect electrically with an electrical lead inserted therein. Moreover, in those electrical breadboards used as element connecting and signal coupling devices, hereinafter referred to as terminal strips, the compartments and contacts are arranged at equidistant spacing in a two-dimensional array, say having approximately five contacts and compartments across the strip and say approximately thirty or more contacts and compartments along the length of the strip. Each row of five contacts across a terminal strip may be considered a set of contacts and provision is made usually within the housing electrically to connect the contacts of each respective set in parallel. Thus, by a single set of five contacts five individual electrical leads, which are inserted to engagement with respective contacts of the set, such leads become electrically connected in common. One reason for having the contact sets arranged five across, even though all five contacts of a given set often may not be used, is to provide size versatility for the electrical breadboard for use with electrical components of a wide variety of sizes.

Usually the prior electrical breadboard housing is fixedly, i.e. usually non-adjustably, connected or attached to a support board for use.

Another type of breadboard member is a distribution strip, the purpose of which typically is to provide power distribution to a variety of locations in an electrical circuit.

SUMMARY OF THE INVENTION

In accordance with one aspect of the present invention, a breadboard assembly to facilitate connecting electrical circuits comprises a breadboard member including a housing, plural electrical contacts in the housing, openings in at least one surface of the housing for permitting access for connection to respective contacts, and a tray for adjustably holding at least one member in operative position therein.

In accordance with another aspect of the invention there is provided for use in a breadboard assembly to facilitate connecting electrical circuits, including a tray-like support or holding means for adjustably holding at least one breadboard member in operative position therein, an improvement which comprises a breadboard member including a housing, plural electrical contacts in the housing, openings in at least one surface of the housing for permitting access for connection to respective contacts, and means on the housing for cooperatively interengaging the tray-like support to mount the member on the tray-like support.

In accordance with still another aspect of the invention, a tray is provided for holding breadboard members as an assembly to facilitate connecting electrical circuits. Such tray comprises a tray support body, walls upstanding from the body to guide such breadboard members therebetween, and mechanical means for mechanical interengagement with at least part of at least one breadboard member adjustably to hold the same in the tray secured against substantial relative movement in at least one direction.

Other features of the invention include a means for interlocking one breadboard member to another and/or to a tray-like support for breadboard members as well as a means for interlocking tray-like supports in side-by-side or end-to-end relation. Further features include a variety of breadboard members, including spacers, breadboard member carriers, terminal strips, distribution strips, power packages, binding post strips, specialized strips, and so on, all of which will be described in greater detail below.

With the foregoing in mind, it is a primary object of the present invention to provide a breadboard assembly having a high level of versatility, being capable of facile formation in a wide variety of configurations.

Another object is to reduce the cost for breadboard assemblies.

An additional object is to minimize the space requirements for a breadboard assembly.

A further object is to facilitate expansion of a breadboard assembly.

Still another object is to provide specialized breadboard members for use in a breadboard assembly.

Still an additional object is to provide a breadboard assembly and parts thereof improved in the noted respects.

Still a further object of the invention is to facilitate assembling, maintaining assembled, and disassembling a breadboard assembly.

These and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawings setting forth in detail certain illustrative embodiments of the invention, these being indicative, however, of but several of the various ways in which the principles of the invention may be employed.

DESCRIPTION OF THE PREFERRED EMBODIMENT

Figures 1, 2, 3:
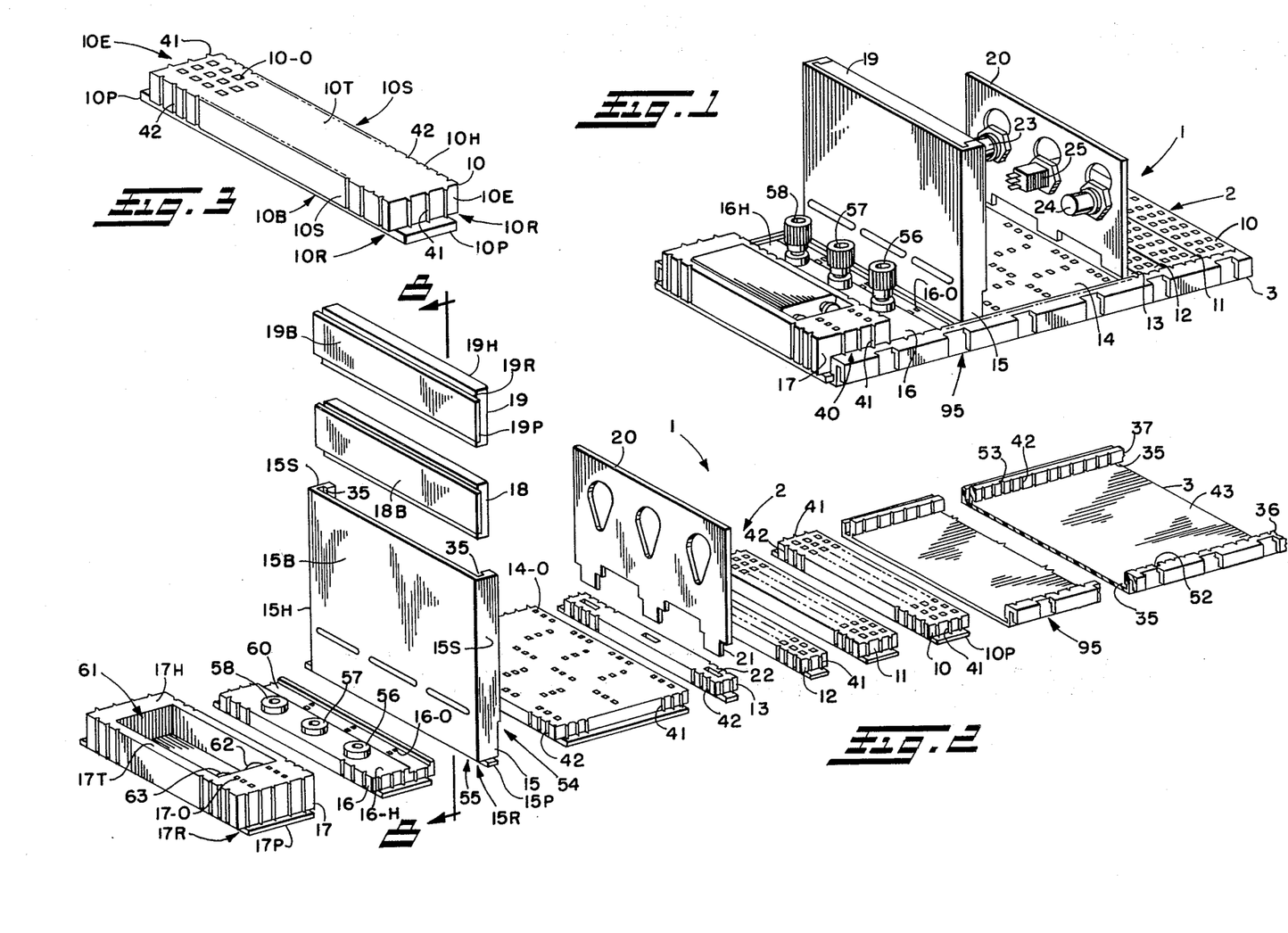
FIG. 1 is a perspective view of an assembled breadboard assembly in accordance with the present invention.
FIG. 2 is an exploded isometric view of the breadboard assembly of FIG. 1.
FIG. 3 is an isometric view of a terminal strip of the breadboard assembly of FIG. 1.
Figure 4:
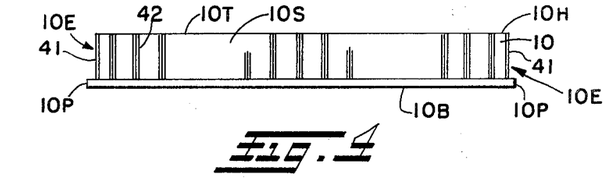
FIG. 4 is a side elevation view of the terminal strip of FIG. 3.
Figure 5:
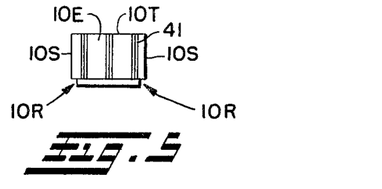
FIG. 5 is an end elevation view of the terminal strip of FIG. 3.
Figure 6:
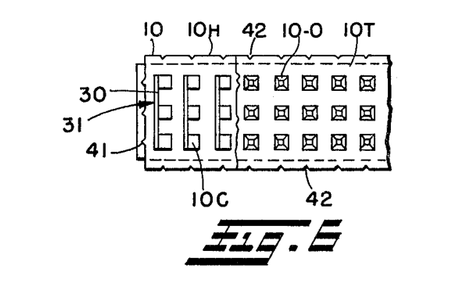
FIG. 6 is a top plan view, partly broken away to show several contact sets, of the terminal strip of FIG. 3.

Referring now in detail to the drawings, wherein like reference numerals designate like parts in the several figures, and initially to FIGS. 1 and 2, a breadboard assembly in accordance with the present invention is generally indicated at 1. The purpose of the breadboard assembly 1 is to facilitate using electrical components, connecting electrical circuits, distributing power to electrical circuits, effecting connections to, signal input and retrieval with respect to, and control of electrical circuits and electrical and electronic components, preferably with minimal cost.

Thus, the fundamental features of the breadboard assembly 1 include one, or in the preferred embodiment a plurality of them, breadboard member generally designated 2 and a tray 3 for adjustably holding at least one breadboard member in operative position therein. The breadboard member itself includes a housing and at least in some instances also includes plural electrical contacts in the housing with openings in the latter in at least one surface thereof for permitting access for connection to respective contacts within the housing.

An example of a type of breadboard member and contact including a housing body, internal compartment within the housing, an access to each compartment through a wall in the housing for insertion of a member therethrough, and electrical contacts in respective compartments with plural respective contacts being connected together in individual sets, is disclosed in copending, commonly assigned U.S. patent application Ser. No. 107,352, filed Dec. 26, 1979, for "Variable Effective Length Cantilever Contact and connector", the inventor thereof being John N. Tengler. Such a breadboard member disclosed in the mentioned patent application may be used with the modifications apparent below as a breadboard member in the present invention, and, accordingly, the disclosure of such patent application hereby is incorporated by reference.

As is illustrated in FIGS. 1 and 2, the breadboard assembly 1 includes a plurality of breadboard members 2 adjustably mounted in the tray 3, including a pair of side-by-side terminal strips 10, 11, a distribution strip 12, a spacer 13, a discrete component strip 14, a further or supplemental tray-like carrier 15, a terminal post strip 16, and a power supply containing strip 17. Moreover, mounted in the supplemental carrier 15 are shown (in FIG. 2) a light emitting diode (LED) terminal strip 18 and a multiple, say seven, segment alphanumeric display terminal strip 19. Also, an additional support plate 20 may be mounted by tabs 21 fitting into slots 22 in the spacer strip 13. The additional support plate 20 may have openings or other means for mounting light indicators 23, 24, switch 25, or the like, which may be electrically coupled to various circuits connected in the breadboard assembly 1 for display and/or control purposes.

For convenience, each of the members 10-19 will be referred to as a breadboard member, vis-a-vis its ability to be slid into and held by a tray 3, even though, for example, the spacer 13 and supplemental carrier 15 may not, in fact, have their own contacts nor need the terminal post strip 16 and power supply containing strip 17, if desired. However, each of the breadboard members 10-19 commonly has a housing designated by the suffix H joined with the reference numeral of the particular member, and each housing preferably is formed of electrically non-conductive material, such as plastic or plastic-like material made by an injection molding process. The remaining parts of the breadboard member (terminal strip) 10 will be described in greater detail below with reference to FIGS. 3-6; however, it will be appreciated that the various letter suffixes used in such description to designate parts of such breadboard member are applicable, as is appropriately illustrated in the drawings, to the various other breadboard members of the breadboard assembly 1.

Turning now more particularly to FIGS. 3-6, the housing 10H of the terminal strip 10 has a pair of side walls 10S, a pair of end walls 10E, and a top wall or surface 10T. Openings 10-O through the top surface 10T provide through access by members inserted therein to engage respective contacts 10C (FIG. 6) within internal compartments (not shown) in the housing 10H. If desired, there need not necessarily be a separate compartment for each contact 10C as long as means are provided to hold the contacts in relatively fixed spacial relation within the housing 10H. Moreover, in the terminal strip 10 the contacts 10C are arranged at equidistant locations relative to each other in an array or pattern generally depicted in FIG. 6. Preferably, three contacts 10C in a common row are electrically interconnected, and perhaps mechanically so as well, by an electrically conductive connecting strip 30 to form a contact set 31. Typically there would be more than ten, and frequently as many as 25 to 30, rows of contact sets in a single terminal strip 10, although, if desired, more or fewer such contact sets may be used.

At the bottom of each end wall 10E is a projection or protrusion 10P, the purpose of which is to cooperate with an open channel-like recess 35 in each side wall 36, 37 of the tray 1 or the supplemental carrier 15 to assure holding of the terminal strip 10 securely in the tray resisting movement in at least one and, relative to the tray, usually at least two directions, although the terminal strip ordinarily may be slid in the tray in the direction parallel to the axial extents of the respective channel-like recesses 35.

Figure 13:
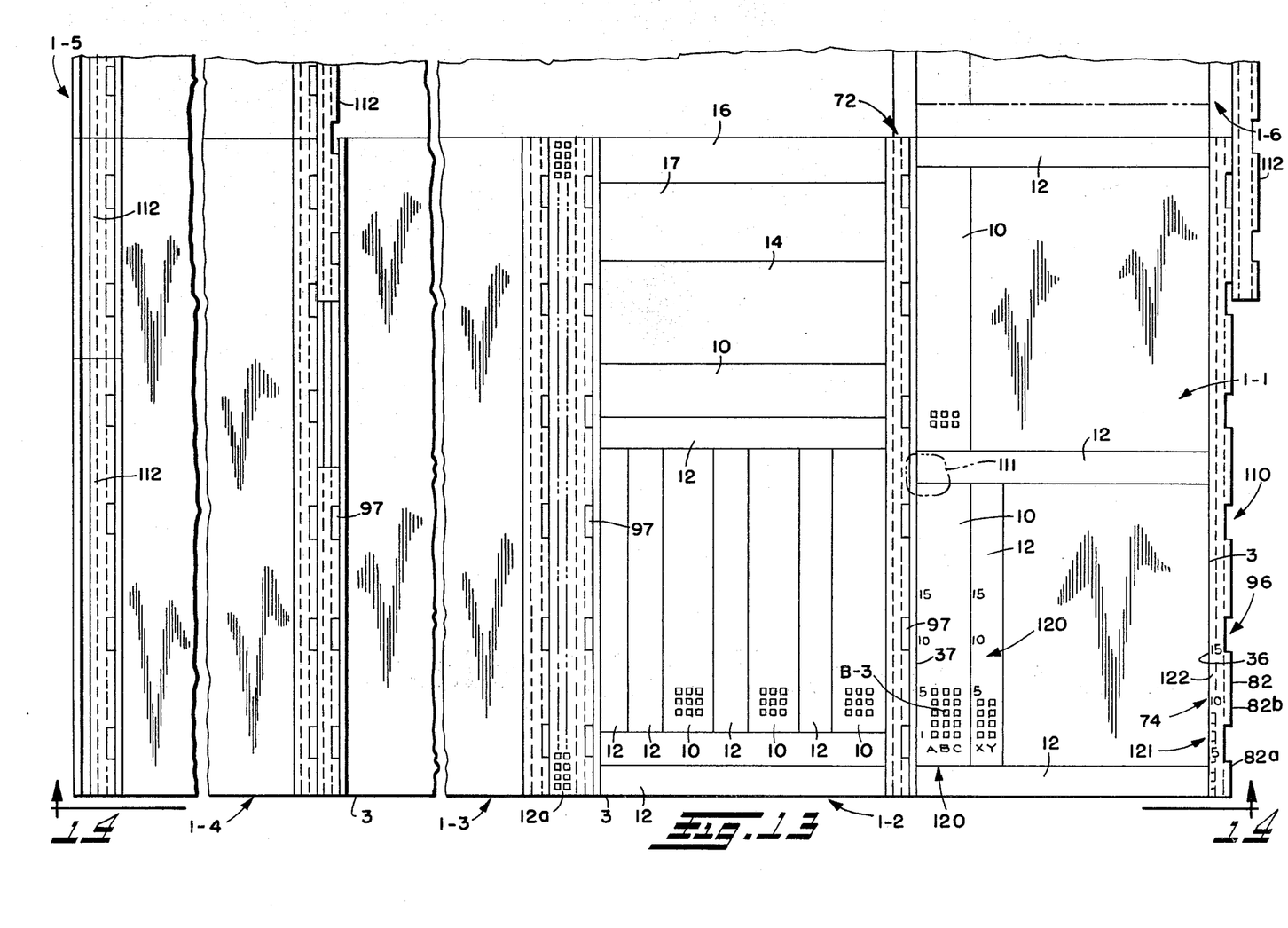
FIG. 13 is a top plan view of a particular configuration of utilization of a breadboard assembly in accordance with the present invention.

Furthermore, in accordance with the preferred embodiment and best mode of the invention, adjacent the bottom of each side wall 10S of the terminal strip 10 is a respective open channel-like recess or undercut 10R. Thus, with two breadboard members, such as terminal strips 10, located at spaced apart locations in a tray, such as the tray 3, with the respective projections or feet 10P holding the breadboard members in position in the tray in cooperation with the channel-like recesses 35, thus providing a cooperative mechanically interengageable means 40 operable to permit the slidable holding of the members in the tray, the opposing channel-like recesses 10R of such spaced-apart members may be used to hold other breadboard members in the breadboard assembly 1 by cooperative interengagement with the respective projections, such as projections 10P, thereof in a spacial orientation generally perpendicular to that of the breadboard members held in the tray 3. This arrangement is shown in FIG. 13.

Figure 12:
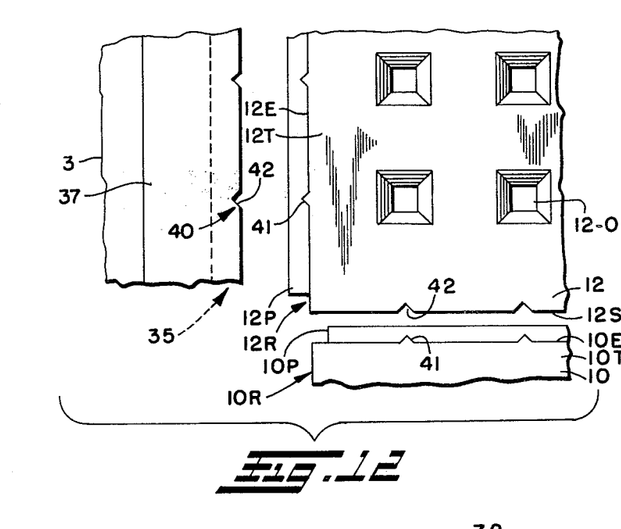
FIG. 12 is an enlarged fragmentary exploded top plan view of the resiliently deformable interengagement or indexing association of breadboard members and of a breadboard member and tray-like carrier.

As is illustrated representatively in several of the figures, and particularly in FIGS. 1 and 2, a resiliently deformable interengaging indexing mechanism 40 is provided for forgivingly resisting sliding movement of members in the tray 3 thereby to hold respective breadboard members relatively securely in desired positions in the tray of a breadboard assembly. The mechanism 40 includes plural male points or projections 41, preferably having sidewalls that define a right angle at their apex, and plural similarly shaped female recesses 42. The points 41 and recesses 42 are equidistantly spaced, respectively, along the end walls of the breadboard members and along the sidewalls of the breadboard members and sidewalls 36, 37 of the tray 3. The materials of which the tray 3 and breadboard members are made and the size and shapes of the points 41 and recesses 42 are such that resilient deformation of the indexing mechanism 40 is permitted allowing a sliding of members in a tray, e.g. as seen in FIG. 1, upon application of adequate force. The indexing mechanism 40 holds the breadboard members in position, e.g. as seen in FIG. 1, in the tray 3, and, e.g. as seen in FIGS. 12 and 13, in position with respect to other breadboard members, which themselves are held in the tray.

The spacing patterns of the points 41 and recesses 42 in the respective walls in which they are formed preferably are the same as that of the openings, such as openings 10-O, to provide relatively optimum versatility of usage and positioning capability in a breadboard assembly.

Although points 41 and recesses 42 are shown for convenience of illustration in several figures and on part or all of various side and end walls of respective members and walls of the trays, it will be appreciated that such points and recesses preferably extend along the entire walls in the manner described. Also, although the points and recesses preferably extend along the entire height of respective walls in which they are formed, shorter heights may be used. Furthermore, it will be appreciated that other types of resiliently deformable indexing means may be used, such as interengageable bumps and recesses formed in the bottom wall 43 of the tray 3 and bottom walls of respective breadboard members.

If desired, the bottom 10B of the terminal strip 10 may be solid or closed, such as the bottom 18B of the LED terminal strip 18 (FIG. 2), or, if desired, the bottom 10B may be relatively open in the manner disclosed in the above-mentioned patent application.

Figure 7:
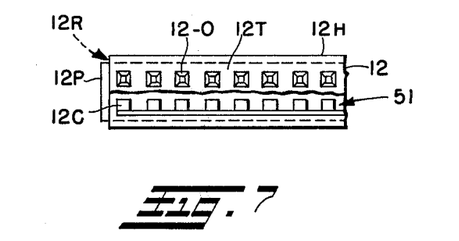
FIG. 7 is a top plan view, partly broken away to show one of the contact sets, of a distribution strip of the breadboard assembly of FIG. 1.

A distribution strip 12, shown in FIGS. 1, 2 and 7, includes two sets of contacts 51 (FIG. 7), the other set not being seen being beneath the top wall 12T of the housing 12H. Each contact set extends over the length of the housing 12H and has multiple contacts 12C to achieve access through the top wall 12T is provided via openings 12-O. In using the distribution strip 12, the opposite polarity terminals of a power supply may be connected to the respective contact sets at one respective contact of each, and the other contacts of each set then may be connected to various points in circuits connected via the breadboard assembly 1 to provide power thereto.

As was noted above, the spacer 13 may or may not include contacts, although in the preferred form the spacer simply provides a spacing function and/or a support function for the additional support plate 20. Moreover, if desired, slots 52, 53 may be formed at certain locations in the side walls 36, 37 of the tray 3 to provide independent support of an additional support plate 20 or the like without the need for a spacer 13.

In the discrete strip 14 a plurality of contact sets, not shown, for they are beneath the top wall 14T of the housing 14H in alignment with respective openings 14-O, are placed in a pattern intended for facilitating physical support and mechanical and electrical connection of discrete, usually relatively large, electrical components, such as a relatively large capacitor, resistor, or the like. Moreover, the discrete strip 14 may be designed insofar as its contact placement is concerned to accommodate a particular type of electronic component, such as a large scale integrated circuit package. The openings 14-O are arranged, as is illustrated in FIGS. 1 and 2, in an exemplary pattern in groups of three, with there preferably being a set of mechanically and electrically interconnected contacts, three in a set, beneath each group of three such openings in a manner similar to that described above with reference to the contact sets 31 in the terminal strip 10. However, if desired, more or fewer contacts may be provided in each set both in the discrete strip 14 in the illustrated or other patterns as well as in any of the other breadboard members in accordance with the invention. Thus, it will be appreciated that the discrete strip 14 not only facilitates connection of particular types of electrical components but also minimizes cost to effect the same in the breadboard assembly 1 by reducing the total number of necessary contacts to be housed in the discrete strip 14 and thus the materials and labor cost for manufacturing the same.

Turning now to the further or supplemental tray-like carrier 15, such carrier has side walls 15S with channel-like receses 35, and a bottom wall 15B joining the side walls, all formed and cooperative in a manner similar to those corresponding parts of the tray 3 to provide a support function for breadboard members, such as the members 18, 19, inserted therein. In addition, the carrier 15 has a base 54 preferably integrally formed as a single molded part with the side walls and bottom wall, and at the bottom of the base is a mounting means 55 including a projection 15P and an open channel-like recess 15R for mounting the carrier 15 in the tray 3 and/or for providing a mounting mechanism for additional breadboard members, as aforesaid. Thus, with the carrier 15 supported in the tray 3, the carrier 15 provides an additional dimensional direction for supporting breadboard members, such as the members 18, 19, in the manner generally illustrated in the drawings, thereby providing space efficiency of multiple connections effected in the breadboard assembly 1 in accordance with the present invention.

In the housing 16H of the terminal post strip 16 are mounted three conventional terminal posts 56, 57, 58 which may be used for a variety of electrical connection functions, as is well known. Moreover, in the top wall 16T there may be formed an index groove 60, the purpose of which is to enable placement of a decal or other tag-like label on which certain identifying information may be written. Furthermore, if desired, the housing 16H may include three sets of openings 16-O, each set including two or three such openings, with contacts therein placed and held in a manner similar to those contacts mentioned above with reference to the breadboard member 10. Such contact sets may be connected internally to the respective terminal posts 56–58.

In the housing 17H of the power supply containing means 17 may be formed a compartment 61 for containing a standard battery, such as a standard 9-volt battery or the like. Battery contacts 62, 63 may be provided to connect with the terminals of such a battery, and such battery contacts may be internally connected with respective contact sets, not shown, located beneath the two sets of three openings 17-O in the top wall 17T of the housing 17H. The power supply containing means 17 may also be designed, as will be well appreciated, to contain other types of power supplies, other size batteries, etc.

Figure 8:
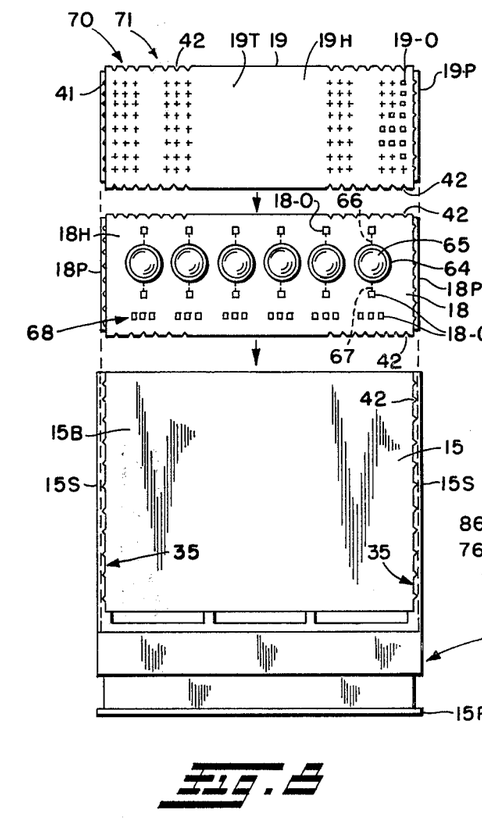
FIG. 8 is an exploded front elevation view of a further or supplemental tray-like carrier, a light emitting diode terminal strip and a seven segment alphanumeric display terminal strip looking generally in the direction of the arrows 8—8 of FIG. 2.

Referring now to the LED terminal strip 18, which is seen most clearly in FIGS. 2 and 8, such strip includes a plurality of sockets 64 for receiving and providing electrical connections to respective light emitting diodes 65. Terminals in the sockets 64 may be connected to respective contacts, not shown, for they are located beneath the top wall 18T, by connections 66, 67. Therefore, for example, a connection to one terminal in the socket 64 may be effected via a lead inserted through the opening 18-O to engage the contact therebeneath coupled to the connection 66, and a similar opposite polarity connection may be provided via a lead inserted through the opening 18-O to engage the contact therebeneath coupled with the connection 67. Ordinarily the light emitting diodes 65 may be removed and/or replaced in the respective sockets 64. Also, if desired, a plurality of contact sets of, for example, three contacts each, as was the case in the above-described terminal strip 10, may be provided in the housing 18H positioned and grouped in the manner shown generally at 68 to facilitate joining connections leading up to respective light emitting diodes.

The multiple segment alphanumeric display terminal strip 19 (FIGS. 2 and 8) includes in the housing 19H a plurality of openings 19-O beneath which are located respective contacts arranged in sets of three in the same manner as the illustrated pattern for the openings 19-O as shown, thus being similar to the contact sets 31 described above with respect to the terminal strip 10. In particular, the patterns or arrangements of contacts in the strip 19 are such that conventional seven segment display elements may be conveniently connected thereto, for example with the multiple leads along one side of one such display package being connected to the respective contacts located in the column 70 and the respective leads located along the other side of such package connected to the respective contacts in the column 71. The remaining contacts in each set of which one respective contact is in one of the columns 70, 71, may be used for electrical connection purposes by insertion of leads through respective openings 19-O to input signals to the respective leads or terminals of the display package. The display terminal strip 19 may be adapted to support and connect one, preferably three, and even more, depending on the physical size requirements, such display packages.

Figure 9:
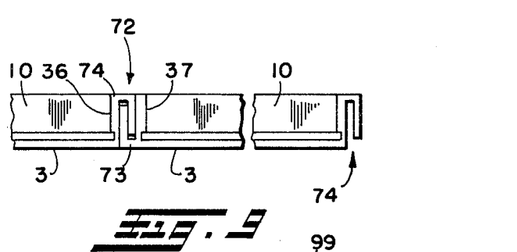
FIG. 9 is an end elevation view of a pair of interconnected breadboard assemblies.

Referring now to FIG. 9, there is illustrated a mechanism for interlocking plural trays in parallel side-by-side arrangement generally designated at 72. Such mechanism includes at one side wall of each tray a U-shape receptacle 73 and in the opposite side wall of each tray an inverted U-shape receptacle 74. The U-shape receptacles may interengage each other in the manner generally illustrated at 72 in FIG. 9 to provide relatively secure interconnection of a pair of adjacent trays.

Figure 10:
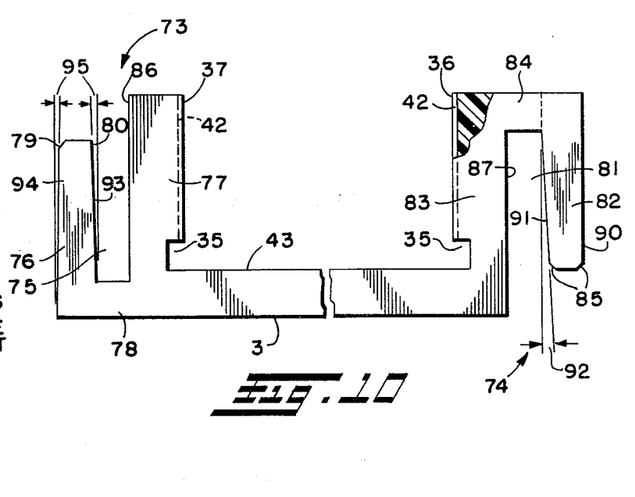
FIG. 10 is an enlarged end view of a tray-like carrier showing the interconnect arm angles in the side walls.

Turning to FIG. 10, the U-shape receptacle 73 has a central open volume 75 bounded on two sides by the arms 76, 77 which are joined at base 78; these arms appear as arms in FIG. 10, although it will be appreciated that they actually represent walls of the elongate U-shape or trough-like receptacle 73. At the remote end of the arm 76, i.e. remote from its connection at base 78, is a chamfered corner 79 and a sharp corner 80. The inverted U-shape receptacle 74 also has an open volume 81 bounded by a similar pair of arms 82, 83 joined at base 84. Both corners of the remote end of arm 82 are chamfered at 85.

Each of the inner arms 77, 83, i.e. inner or closer to the functional part of the tray 3 that holds breadboard members, may be considered a reference arm having a reference wall surface 86, 87, respectively. The reference wall surfaces preferably remain directionally fixed relative to other parts of the tray 3, such as the bottom 43 thereof, thus providing a reference direction for the interlock mechanism 72. Each of the relatively outer arms 76, 82 may be considered an insertable arm in that it is insertable into the respective open volume 81, 75 of a mating inverted U or U-shape receptacle of, for example, another tray 3 or as otherwise disclosed herein.

The outer wall 90 of insertable arm 82 preferably is parallel to the reference wall surfaces 86, 87, and it is the purpose of the wall 90 to mate in flat abutment with reference wall surface 86 when the insertable arms 76, 82 of respective trays 3 are inserted in volumes 75, 81. The inner wall surface 91 of insertable wall 82 is angularly disposed by angle 92 at other than parallel relative to the outer wall 90 and thus effects a narrowing taper of volume 81 in an insertion direction thereto. However the dimension of the open volume 81 between the arms 82, 83 at the base 84 is such that the volume preferably receives relatively closely or snugly there the remote end of insertable arm 76, and, therefore, is about the same as or slightly larger than the cross sectional dimension of such remote end; the same is true for the dimensional relation between the remote end of insertable arm 82 and the volume 75 near the base 78.

Moreover, the inner wall 93 and the outer wall 94 of insertable arm 76 are angularly disposed at angles 95 in non-parallel relation to reference wall surface 86, in a manner to effect a narrowing taper of volume 75 in the insertion direction and in a manner to cause a narrowing tapering of the cross-sectional dimension of the arm 76 in a direction leading away from base 78. Preferably the angles 95 are equal and each individually as well as the sum thereof is smaller than angle 92.

To interconnect two trays 3 configured in the manner illustrated in FIG. 10, the arm 76 of one tray is inserted into the volume 81 of the other tray and the arm 82 of the latter is inserted into the volumne 75 of the former. The chamfers 79, 82 facilitate such insertion. Moreover, during such insertion the unchamfered corner 80 of arm 76 follows generally along the wall 91, and one or both of the arms 76, 82, but preferably only the former, will deflect or deform resiliently to an equilibrium position with respect to the opposite arm and respective arms 77, 83 with which they also are engaged. So inserted, a relatively large surface area of engagement occurs between the walls of respective arms of coupled U-shape and inverted U-shape receptacles; and due to the resilient force applied by the deformed arm or arms and the coefficients of static friction of respective walls, preferably the force required to overcome static friction to separate such side-by-side interengaged trays 3 will be sufficiently great to avoid inadvertent separation of the trays.

More particularly, as the arm 76 is inserted into volume 81 the angles and tapers are such that the corner 80 at some point will have to engage the wall 91. At that point during the insertion act, the reference wall surfaces 86, 90 will be in flat abutting engagement. Further insertion of arm 76 will cause corner 80 to slide along the guiding slope of wall surface 91, and cantilever beam-like resilient deflection of the arm 76 will occur in a left-hand or counter-clockwise direction relative to the drawing illustration about a reference location theoretical fulcrum at base 78. The reaction force of the resiliently deflected arm 76 draws the wall surfaces 86, 90 together increasing the normal force therebetween and, thus, the force required to overcome static friction to separate the interconnected trays 3. Preferably the angles, dimensions, tapers, materials, etc. of the interlocking mechanism are such that upon completing insertion of the insertable arms 76, 82, a substantial extent of the respective interengaged walls will be abutting while flat parallel alignment of the tray bottoms 43 is maintained.

Figure 11:
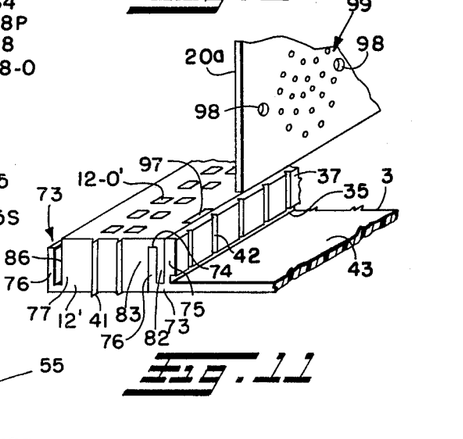
FIG. 11 is a fragmentary isometric view of an edgewise interconnection of a distribution strip and a tray-like carrier of a breadboard assembly.
Figure 14:
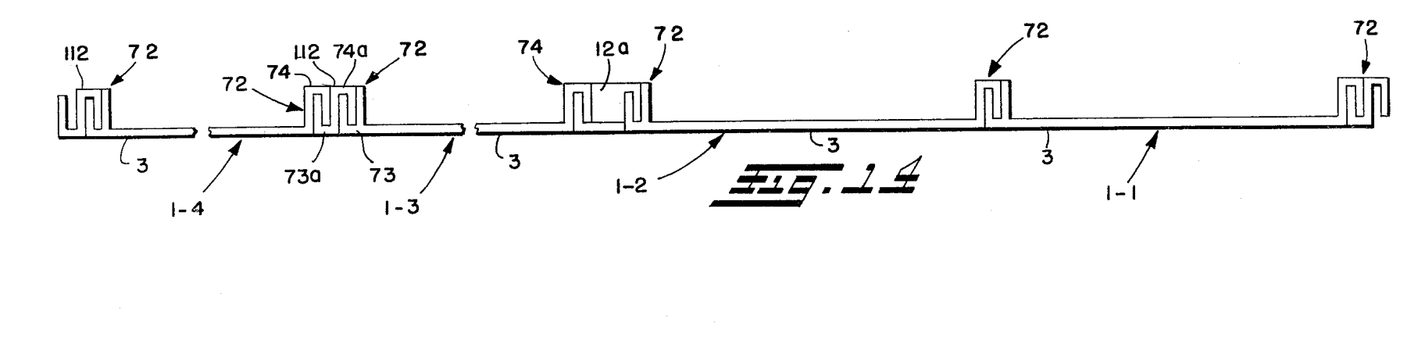
FIG. 14 is an end view of the tray-like carrier interconnection of the breadboard assembly configuration of FIG. 13 with the breadboard members removed.

Moreover, referring to FIG. 11, one or more of the breadboard members 2, such as the distribution strip 12', which is similar to the above described distribution strip 12, primed reference numerals here designating parts corresponding to those in the above described distribution strip, also may be formed with such U-shape and inverted U-shape receptacles 73, 74 in the respective side walls 12S'. Accordingly, using such receptacles, plural breadboard elements may be mechanically interlocked in the same manner as the trays are interlocked by the mechanism 72 described above with reference to FIGS. 9 and 10. In addition, an added dimension may be provided for the breadboard assembly of the invention in the manner illustrated in FIG. 11 by cooperatively using the U-shape or inverted U-shape receptacle of the tray 3 to side-wise mount a breadboard member thereto, such as the distribution strip 12'; also, the breadboard member 12' or the like may be used to connect two trays together in side-by-side or end-to-end relation as shown in FIGS. 13 and 14.

As is seen most clearly in FIGS. 1, 2, 11 and 13, the outer arms 82 of respective inverted U-shape receptacles 74 are linearly discontinuous and define between adjacent arm portions, such as 82a, 82b, voids 96 that are open on one side. When the open side of void 96 is covered or closed, e.g. by the wall surface 86 of arm 77, a receptacle 97 (FIGS. 11 and 13) is formed to receive a tab 21 of an additional support plate, such as the one shown at 20 in FIGS. 1 and 2 or the speaker plate 20a (FIG. 11), which contains holes 98 for mounting a speaker and sound transmitting openings 99. The wall 93 of arm 76 within the volume 81 also forms a boundary for the receptacle 97. Thus, the receptacles 97 provide for edge-wise or side-wise mounting of the plates 20, 20a, or the like, as desired.

If desired, labels, such as letters, numbers, or the like, may be applied to the members to facilitate identifying the respective contacts and connections provided in the various breadboard members 2. Also appropriate labeling may be applied along the surface of one or both of the sidewalls 36, 37 of the tray 3 or the carrier 15 further to facilitate identifying areas of connections and locations to which to slide respective breadboard members for optimum utilization in the breadboard assembly 1.

In view of the foregoing, it will be appreciated that the breadboard assembly 1 in accordance with the present invention provides a high degree of versatility, expansion capability, utilization facility, etc., for circuit breadboarding purposes. Any breadboard member 2 may be located at any location in the tray 3 or in a supplemental carrier 15, as desired, for optimum space utilization and connection convenience, vis-a-vis the electrical and electronic components intended for connection thereby.

Referring to FIGS. 13 and 14, a multiple arrangement 110 of breadboard assemblies 1 in accordance with the present invention is illustrated. Each individual breadboard assembly will be referred to below by a numercial suffix, such as the breadboard assembly 1—1 in which an arrangement employing four distribution strips 12 and two terminal strips 10 is shown with such various breadboard members being held in a tray 3. The area 111 circumscribed by a phantom line may be, for example, the assemblage of elements which are illustrated in exploded view in FIG. 12.

The tray 3 of the breadboard assembly 1-2 is connected at 72 to the tray of the breadboard assembly 1—1 using the above described interconnection of respective U-shape and inverted U-shape receptacles 73, 74. The breadboard assembly 1-2 includes in its tray 3 seven distribution strips 12, four terminal strips 10, a discrete component strip 14, a terminal post strip 16, and a power supply containing strip 17.

The tray 3 of a third breadboard assembly 1-3 is connected to the tray 3 of the breadboard assembly 1-2 by the intermediary of an elongate distribution strip 12a, which is similar to the distribution strip 12' of FIG. 11 but preferably extends over the entire length of the respective trays 3. Alternatively, several individual distribution strips 12 may be used to join the breadboard assemblies 1-2 and 1-3 in the manner described above generally with respect to FIG. 11. The intermediary distribution strip may be used as a main power bus, for example, for the adjacent breadboard assemblies.

A lazy-S-shape, i.e. the shape of the letter S lying on its side, locking connector 112 is shown at several places in FIG. 13. Such locking connector 112 may be used in the manner illustrated in FIGS. 13 and 14 to connect side-by-side trays 3 of the breadboard assemblies 1-3 and 1-4. Alternatively, such locking connectors 112 may be used to enable end-to-end connection of adjacent trays 3 of, for example, the breadboard assemblies 1-4 and 1-5 or the trays 3 of the breadboard assemblies 1-1 and 1-6. The locking connector 112 provides a pair of U-shape and inverted U-shape receptacles 73a, 74a which cooperate with respective inverted U-shape and U-shape receptacles 73, 74 of adjacent trays 3 to hold the same together in the manner illustrated in FIG. 14 for side-by-side connection. In the case of end-to-end connections, such as that illustrated between the breadboard assemblies 1-4 and 1-5 of FIG. 13, only the U-shape or inverted U-shape receptacle portion of the locking connector 112 is required to join the adjacent trays 3.

Moreover, it will be appreciated that the distribution strips 12' or 12a may be used in the same manner as the locking connectors 112 to join end-wise adjacent trays of respective breadboard assemblies. Furthermore, it will be appreciated that the angles of the various arms and walls of the locking connectors 112 preferably are the same as those of the various arms and walls of the receptacles 73, 74 described above with reference to FIG. 10. Further, it will be appreciated that the locking connectors and other similar elements just described may be used to connect trays in end-to-end relation while permitting the tray ends to be relatively open allowing breadboard elements to be slid from one tray to the next and also permitting such connection of trays that have open ends for optimum facility of insertion of breadboard members from both ends.

Although the resiliently deformable interengaging indexing means 40 may be in the form of the above described points 41 and recesses 42 or bumps and recesses, in accordance with the present preferred embodiment and best mode of the invention such means 40 may be only a force or friction fit effected between members 2 or between respective members and the tray 3 without requiring such projections or bumps and recesses. Thus, for example, the size relationship between the open channel-like recess 35 in the tray 3 and the projections or feet, e.g. 10P, on respective members preferably is such that there is a resiliently applied force tending to resist sliding of such feet within the channels. Therefore, a prescribed amount of force would be required to slide a member 2 in a tray 3 avoiding unwanted sliding. Such size relationship may be either in a vertical direction whereby the applied force between the walls of recess 35 and feet 10P, etc., is in a vertical direction or, more preferably, in a lateral or horizontal direction to apply force laterally to the members 2 tending to resist sliding of them in a tray 3. A similar vertical type of size relationship may exist between such feet and the respective open channel-like recesses, e.g. 10R, in the members.

To facilitate identifying locations of openings in respective members 2 indicia preferably are provided on the top wall of each member. Such indicia generally designated 120 in FIG. 13 preferably are of alphanumeric type for easy use but may be of other types as well, such as color coding, pictorial coding, etc. The indicia 120 should enable convenient useage in the X-Y or Cartesian coordinates of the top plane of each member; therefore, for example, preferably along one edge alphabet letters are used, say A, B and C, to identify the individual contacts 10C of each contact set 31 beneath the respective horizontally shown rows of openings 10-0 in the terminal strip 10 in the lower right quadrant of FIG. 13, and numbers along another edge identify the individual contact sets 31. As is seen in FIG. 13, the number indicia may be applied at intervals of every five contact sets or at closer or further intervals as space or other restrictions permit. Accordingly, in the terminal strip 10 mentioned, a location B-3, for example, identifies the middle contact, i.e. in the B column, in the third contact set, as shown.

Moreover, it is preferred that there be a distinction made between the indicia applied to at least several of the different types of members 2 to facilitate distinguishing between the members both in physical viewing and in instructional useage or text materials. Thus, although terminal strips 10 may be one set of alphabet letters, e.g. the A, B, C shown, the distribution strips 12 preferably use a different set of letters to identify the two contact buses therein, such as the X, Y shown. A similar manner of distinction may be employed in connection with the indicia of the various types of members 2 of the breadboard assembly 1 of the invention.

Furthermore, it also is preferred to employ indicia 121 on the top tray 3. Such indicia identify the locations along the tray at which members 2 are located or are to be located, at which connections are made or are to be made, etc. Preferably such indicia 121 are located on the top surface 122 of the tray wall 36 which ordinarily would not be expected to be covered by one of the several types of interlock mechanisms 72 described above.

STATEMENT OF INDUSTRIAL APPLICATION

Thus, the breadboard assembly 1 in accordance with the present invention may be utilized to facilitate connecting electrical circuits for testing purposes, utilization purposes, and the like.

We claim:

1. A breadboard assembly apparatus to facilitate connecting electrical circuits, comprising a breadboard member including a housing, plural electrical contacts in said housing, openings in at least one surface of said housing for permitting access for connection to respective contacts; and a tray for adjustably holding at least one member in operative position therein; said tray and member including mechanically interengagable means for securing said member in said tray against substantial relative movement in at least one direction, and said tray being of a size adequate to hold a plurality of said members.

2. The assembly of claim 1, said mechanically interengageable means comprising a protrusion on at least one side of said housing and a channel-like recess in said tray for receiving therein in sliding engagement said protrusion.

3. The assembly of claim 2, said mechanically interengageable means comprising a protrusion on each of opposite sides of said housing and a channel-like recess at each of opposite sides of said tray.

4. The assembly of claim 3, said tray having an open wall at least at one end thereof for permitting insertion and removal of said member therein with said protrusions in respective channel-like recesses.

5. The assembly of claims 3 or 4, said tray having a length adequate to hold a plurality of said members.

6. The assembly of claim 5, at least two of said members having recesses along at least one side thereof for holding therebetween, when themselves positioned in said tray, at least one further member by receiving said protrusions of the latter to secure the same in said tray to prevent relative movement in at least one direction of said further member.

7. The assembly of claim 6, wherein said at least one further member comprises a plurality of the same held in position by said at least two of said members.

8. The assembly of claim 6, each of said members having recesses along opposite sides thereof.

9. The assembly of claims 1 or 4, said member comprising a terminal strip including a housing having a plurality of sets of electrical contacts therein, each set having plural electrical contacts electrically connected to one another.

10. The assembly of claim 9, said sets being positioned in said housing in spaced-apart parallel rows.

11. The assembly of claim 10, each set including at least three mechanically interconnected contacts, and said plurality of sets of contacts including at least ten of the same aligned in an array placing said contacts at equidistant spacing from respective adjacent ones.

12. The assembly of claims 1 or 4, said member comprising a distribution strip including a housing having at least one set of a plurality of mechanically and electrically connected contacts therein.

13. The assembly of claim 12, said housing having a width and a relatively greater length, and said set being about as long as such length, with said contacts being positioned approximately at equidistant spaced-apart locations.

14. The assembly of claim 12, said at least one set comprising a pair of electrically isolated sets of contacts positioned in parallel spaced-apart positions in said housing.

15. The assembly of claim 1, further comprising a distribution terminal strip, said distribution terminal strip comprising a housing having at least one set of a plurality of mechanically and electrically connected contacts therein.

16. The assembly of claims 1 or 4, further comprising a spacer of a shape similar to said housing for spacing relatively adjacent members.

17. The assembly of claim 16, further comprising support means for supporting electrical hardware, and said spacer having openings therein for receiving part of said support means to mount the same in relatively fixed position in said spacer.

18. The assembly of claims 1 or 4, said member comprising a discrete terminal strip for mounting thereon at least one discrete electrical component to facilitate electrical connection thereto, said discrete terminal strip including a housing having plural sets of plural electrical contacts spaced in said housing in position for facile connection with the leads of such discrete electrical component.

19. The assembly of claim 18, wherein each set of contacts comprises at least three mechanically and electrically interconnected contacts, and said housing openings comprising a plurality of the same, each being positioned for guiding a respective lead to each respective contact used therein.

20. The assembly of claims 1 or 4, said member comprising a terminal post strip including a plurality of terminal post means mounted in said housing for connecting electrical leads.

21. The assembly of claim 1, further comprising a terminal post strip, including a housing and a plurality of terminal post means in said housing for connecting electrical leads.

22. The assembly of claims 1 or 4, said member comprising a power supply containing means, including a compartment means for containing the power supply, and said contact means being connected to respective polarity outputs of such power supply.

23. The assembly of claim 22, such power supply comprising a battery, and further comprising further contact means for connecting with terminals of such battery, said contact means and said further contact means respectively being electrically interconnected.

24. The assembly of claim 1, further comprising a power supply containing means including a housing, a compartment means in said housing for containing a power supply, and said contact means being connected to respective polarity outputs of such power supply.

25. The assembly of claims 1 or 4, said member comprising a light emitting diode terminal strip means for supporting light emitting diodes in mechanical and electrical connection for selective energization thereof, including socket means for receiving such light emitting diodes and contact means for electrically coupling electrical signals to said light emitting diodes.

26. The assembly of claim 25, further comprising plural sets of plural interconnected electrical contacts with each set being positionally associated with a respective light emitting diode.

27. The assembly of claim 25, said socket means including a plurality of the same for receiving a plurality of light emitting diodes.

28. The assembly of claim 1, further comprising a light emitting diode terminal strip means for supporting light emitting diodes in mechanical and electrical connection for selective energization thereof, including a housing, socket means for supported by said housing for receiving such light emitting diodes and contact means for coupling electrical signals to said light emitting diodes.

29. The assembly of claims 1 or 4, said member comprising a multiple segment display terminal strip means, said contact comprising plural sets of plural contacts, one set for each lead of such a multiple segment display, and said contacts being positioned in said housing to receive respective leads of such display and to connect signals thereto.

30. The assembly of claim 1, further comprising a multiple segment display terminal strip, including a housing, a plurality of contacts in said housing, said contacts comprising plural sets of plural contacts, one set for each lead of such display and said contacts being positioned in said housing to receive respective leads of such display and to connect signals thereto.

31. The assembly of claims 1 or 4, said tray being capable of holding said member at least approximately in a first plane, and further comprising a further tray for holding at least one member in at least approximately a second plane, and mounting means for mounting said further tray on said first mentioned tray.

32. The assembly of claim 31, said mounting means comprising protrusions at opposite sides of said further tray for sliding engagement in channel-like recesses of said first mentioned tray.

33. The assembly of claim 32, said further tray comprising plural channel-like recess means for sliding engagement with opposite protrusions of a member.

34. The assembly of claims 1, 4 or 15, further comprising means for forgivingly resisting sliding movement of the member in said tray.

35. The assembly of claim 35, said means for resisting comprising protrusion means on at least one of said member and tray and recess means in the other of said member and tray.

36. The assembly of claim 1, further comprising means for interlocking plural trays.

37. The assembly of claim 36, said means for interlocking comprising a U-shape receptacle along one wall of one tray and an inverted U-shaped receptacle along one wall of another tray.

38. The assembly of claim 37, each tray having two parallel walls with a U-shape receptacle along one wall and an inverted U-shape receptacle along the other wall.

39. The assembly of claim 1, further comprising means for interlocking one member to another.

40. The assembly of claim 39, said means for interlocking comprising a U-shape receptacle along one side of one member and an inverted U-shape receptacle of another member, said receptacles being interengageable to hold said members together.

41. The assembly of claim 1, further comprising means for interlocking one member on a side wall of said tray.

42. The assembly of claim 41, said means for interlocking comprising a U-shape receptacle along at least part of one side of one of said tray and member and an inverted U-shape receptacle along at least part of one side of the other of said tray and member, said receptacles being interengageable to hold said tray and member together.

43. The assembly of claim 42, said member comprising a distribution strip including a housing having at least one set of a plurality of mechanically and electrically connected contacts therein.

44. The assembly of claim 43, said housing having a width and a relatively greater length, and said set being about as long as such length with said contacts being positioned approximately on equidistant spaced centers, and wherein said at least one set comprises a pair of electrically isolated sets of contacts positioned in parallel spaced-apart positions in said housing.

45. For use in a breadboard assembly to facilitate connecting electrical contacts, including means for adjustably holding at least one breadboard member in operative position therein, the improvement comprising:
a breadboard member including a housing, plural electrical contacts in said housing, openings in at least one surface of said housing for permitting access for connection to respective contacts, and means on said housing for cooperatively interengaging said means for holding to maintain the former on the latter.

46. The improvement of claim 45, said member comprising a terminal strip including a housing having a plurality of sets of electrical contacts therein, each set having plural electrical contacts electrically connected to one another.

47. The improvement of claim 45, said member comprising a distribution strip including a housing at least one set of a plurality of mechanically and electrically connected contacts therein.

48. The improvement of claim 45, said member comprising a terminal post strip including a plurality of terminal post means mounted in said housing for connecting electrical leads.

49. The improvement of claim 45, said member comprising a power supply containing means, including a compartment means for containing the power supply, and said contact means being connected to respective polarity outputs of such power supply.

50. The improvement of claim 45, said member comprising a light emitting diode terminal strip means for supporting light emitting diodes in mechanical and electrical connection for selective energization thereof, including socket means for receiving such light emitting diodes and contact means for electrically coupling signals to said light emitting diodes.

51. The improvement of claim 45, said member comprising a multiple segment display terminal strip means, said contacts comprising plural sets of plural contacts, one set for each lead of such a multiple segment display, and said contacts being positioned in said housing to receive respective leads of such display and to connect signals thereto.

52. The improvement of claim 45, further comprising means for interlocking one member to another.

53. The improvement of claim 52, said means for interlocking comprising a U-shape receptacle along one side of one member and an inverted U-shape receptacle of another member, said receptacle being interengageable to hold said members together.

54. The improvement of claim 45, said means for holding comprising a tray, and further comprising means for interlocking one member on a side wall of said tray.

55. The improvement of claim 54, said means for interlocking comprising a U-shape receptacle along at least part of one side of one of said tray and member and an inverted U-shape receptacle along at least part of one side of the other of said tray and member, said receptacles being interengageable to hold said tray and member together.

56. A tray apparatus for holding breadboard members as an assembly to facilitate connecting electrical circuits, comprising a tray support body, walls upstanding from said body to guide such breadboard members therebetween, and mechanical means for mechanically interengaging with at least part of at least one breadboard member adjustably to hold the same in the tray secured against substantial relative movement in at least one direction.

57. The tray of claim 56, said tray being capable of holding said members at least approximately in a first plane, a further tray for holding members in another plane, and further comprising mounting means for mounting said first mentioned tray on said further tray.

58. The tray of claim 57, said mounting means comprising protrusions at opposite sides of said further tray for sliding engagement in channel-like recesses of said first mentioned tray, and said further tray comprising plural channel-like recess means for sliding engagement with opposite protrusions of a member.

59. The apparatus of claim 56, said walls being generally parallel and on opposite sides of said body, said tray having opposite open ends between said walls and via which breadboard members may be inserted into the tray and further comprising means for interlocking plural trays, including locking connector means for interlocking plural trays in end-to-end relation.

60. The apparatus of claim 36, said trays having sidewalls between which breadboard members may be held and open ends for permitting positioning of breadboard members onto said tray between said sidewalls, said means for interlocking comprising locking connector means for interlocking plural trays in end-to-end relation.

61. The apparatus of claims 59 or 60, said means for interlocking comprising at least one U-shape or inverted U-shape receptacle in the sidewall of said trays and said locking connector means comprising a locking connector means of a shape cooperable with said receptacle to hold said trays together.

62. The apparatus of claim 61, said trays having a U-shape receptacle in one sidewall and an inverted U-shape receptacle in the other sidewall and said locking connector means comprising a lazy-S-shape connector for connecting plural trays in end-to-end relation and plural trays in side-by-side relation.

63. The assembly of claim 35, said protrusion means comprising triangular shape protrusions on two opposite walls of a breadboard member, said recesses comprising triangular shape recesses along the sidewalls of said tray, and further comprising triangular shape recesses in the other opposite walls of a breadboard member for cooperating with the protrusions of still another breadboard member to hold the latter in position in a tray.

64. The assembly of claim 1, said tray comprising means for supporting relative to said tray a support means for supporting electrical hardware.

65. The apparatus of claims 36, 39, 41, 54, and 59, said means for interlocking comprising apparatus for interconnecting two trays, two members or combinations thereof by mating receptacles, each receptacle having plural walls bounding, respectively, opposite sides of a receptacle volume, one wall of one receptacle being engageable with one wall of the other receptacle upon mutual insertion into respectively opposite receptacles, and means for increasing the force of engagement of said one wall during the continuing of such insertion.

66. The apparatus of claims 37, 40, 41, or 55, said inverted U-shape receptacle having discontinuities in one wall thereof forming slot-like openings open at the top and one side, and the mating wall of a U-shape receptacle coupled to said inverted U-shape receptacle covering such open side thereby to complete a limited slot-like receptacle means for holding a support means for supporting electrical hardware.

67. The apparatus of claim 66, said support means for supporting electrical harware comprising a speaker plate having tabs for holding the same in said limited slot-like receptacle, means for mounting a speaker to said speaker plate and sound transmitting openings in said speaker plate.

68. The assembly of claim 34, said means for forgivingly resisting sliding movement comprising a resilient force-fit frictional interengagement relation between the member and the tray or between members.

69. The assembly of claims 1 or 45 further comprising indicia means for indicating the relative locations of respective contacts in said housing.

70. The assembly of claim 69, said indicia comprising indicia means on said housing for identifying a relative two-dimensional coordinate location.

71. The assembly of claim 70, said breadboard member comprising a plurality of different types of breadboard members, and said indicia means comprising different indicia means for at least two different type of breadboard members, respectively, thereby to distinguish such breadboard members.

72. The assembly of claim 69, said indicia comprising alpha-numeric indicia.

73. The assembly of claim 1, further comprising indicia means on said tray for indicating locations thereon.

* * * * *